US006294296B1

(12) United States Patent
Weigl

(10) Patent No.: US 6,294,296 B1
(45) Date of Patent: Sep. 25, 2001

(54) METHOD AND DEVICE FOR MUTUALLY ALIGNING A MASK PATTERN FORMED IN A MASK AND A SUBSTRATE

(75) Inventor: Bernhard Weigl, Steinheim (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/510,875

(22) Filed: Feb. 22, 2000

(30) Foreign Application Priority Data

Oct. 11, 1999 (DE) .............................................. 199 49 009

(51) Int. Cl.[7] .............................. G03F 9/00; G01B 11/00
(52) U.S. Cl. ............................ 430/22; 356/400; 356/401
(58) Field of Search .............................. 430/22; 356/400, 356/401

(56) References Cited

U.S. PATENT DOCUMENTS 4,778,275   10/1988   van den Brink et al. ........... 356/401

FOREIGN PATENT DOCUMENTS 0 243 520 B1   11/1991   (EP) .
WO 97/35234    9/1997    (WO) .

*Primary Examiner*—Christopher G. Young
(74) *Attorney, Agent, or Firm*—Welsh & Katz, Ltd.

(57) ABSTRACT

In a method for mutually aligning a mask pattern formed in a mask 1 and a substrate 2, on which the mask pattern is to be imaged, by using setting marks 12*a,* 12*b* and 13*a* or 13*b* in the mask 1 and in the substrate 2, the alignment is performed with the aid of an imaging system and a light beam with polarized light 9. A phase shift for the first diffraction orders 20 is undertaken in the beam path 9*a,* 9*b*. Higher diffraction orders 21 and unwanted light are filtered out after the phase shift, and after the filtering out the light beams of the first diffraction orders 20 are detected, and the result is evaluated for the purpose of alignment.

9 Claims, 2 Drawing Sheets

Figure 1:
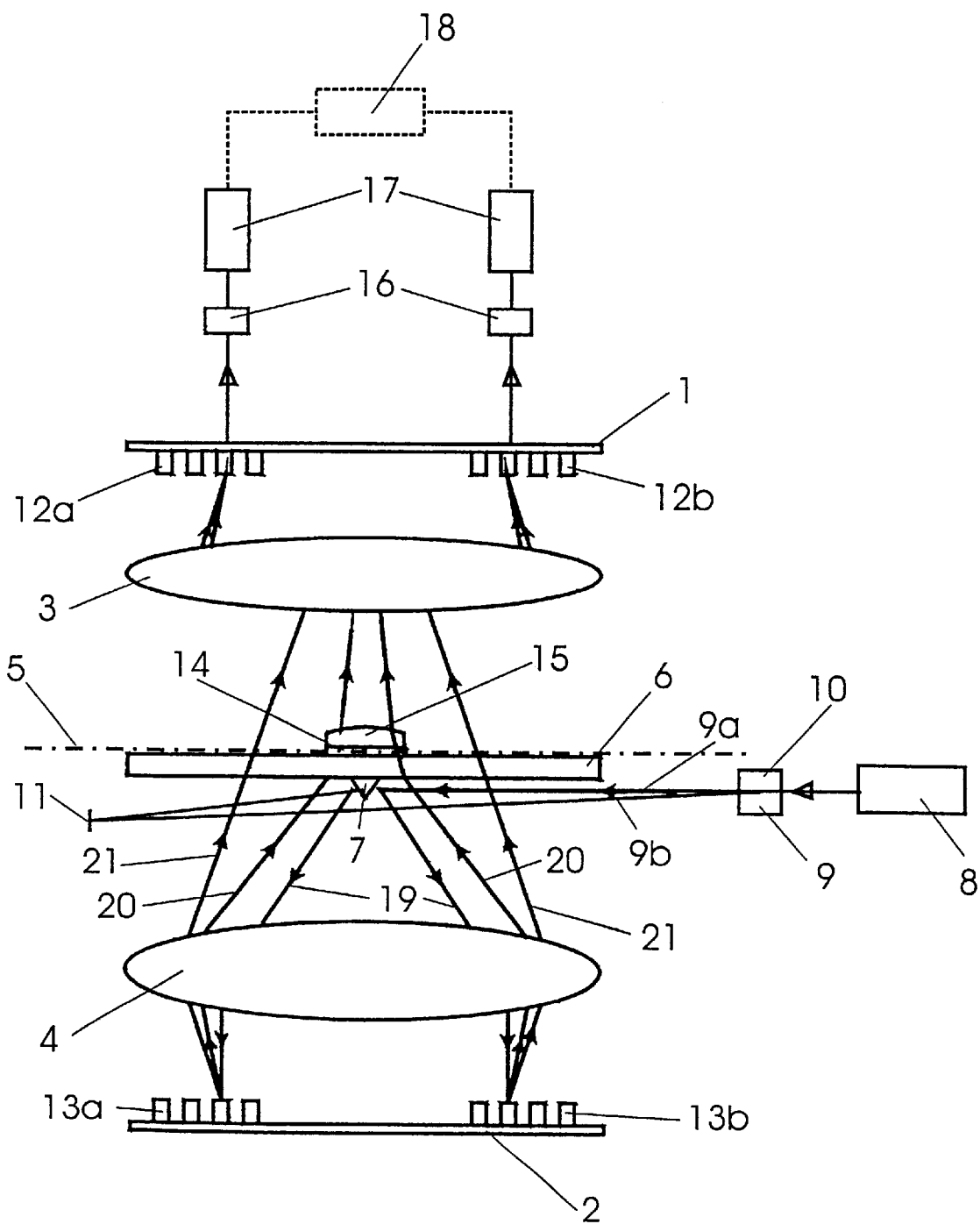

METHOD AND DEVICE FOR MUTUALLY ALIGNING A MASK PATTERN FORMED IN A MASK AND A SUBSTRATE

The invention relates to a method for mutually aligning a mask pattern formed in a mask and a substrate, on which the mask pattern is to be imaged, of the type more closely defined in the preamble of claim 1. The invention also relates to a device for carrying out the method.

In modern very accurate production methods, it is often necessary to align two objects precisely with one another. This requirement obtains, in particular, a semiconductor photolithography for producing chips. In this case, a photoresist is applied to a surf ace of a wafer which is subsequently exposed with the structure to be produced. Parts of the photoresist are stripped away again by means of a chemical development process. The free parts of the semiconductor surface can now be etched, chemically doped, metalized or coated with other materials, with the result that the required complex structures for integrated circuits are produced in several steps. The size of the structure in the case of integrated circuits is given by the wavelength of the radiation to be used for the exposure. The desired structure is imaged in this case onto the photoresist layer from an exposed mask in a photooptically shrunk fashion. The aim of shrinking the circuit structure and/or chips as far as possible encounters limits owing to diffraction effects because of the wavelength of the light of the photooptical lithography.

In the case of the semiconductor lenses mostly used, the positioning of the projected image generated via the mask is implemented on a wafer with the aid of an alignment system. In this case, the first diffraction order of the light reflected by setting marks can be used for the evaluation. In order to suppress disturbing higher diffraction orders, it is known from WO 97/35234 (see FIG. 8), which constitutes the point of departure of the present invention, to arrange an alignment plate in a projection lens. A reflector prism in this case couples in illuminating light, which is generated by a laser and is reflected by the setting marks of the wafer. The reflected zero diffraction order is coupled out by the prism. Situated around on the outside are the first diffraction orders, whose detection is enabled by means of a correction lens which ensures clean imaging. Other diffraction orders fall onto regions outside the correction lens. There, the alignment plate is designed as a dichroic filter, with the result that the light blocks off the alignment wavelength. Instead of designing the alignment plate as a dichroic filter, the latter can also be of locally opaque design (see FIG. 9), thus achieving the same aim, specifically "red blocking" of the illuminating light up to the region of the first diffraction orders, without disturbing the photolithographic method.

In the case of short operating wavelengths in the DUV, the dichroic layers exhibit a reduced suppression of the alignment wavelength and absorption losses and scattering at the operating wavelength.

U.S. Pat. No. 4,778,275 discloses a method and a device for mutually aligning a mask pattern formed in a mask and a substrate on which the mask pattern is to be imaged, use being made of a diaphragm or a pinhole stop to separate undesired signal components from higher diffraction orders (see FIG. 8).

However, it has emerged in practice that, in conjunction with the rising demands and with the shortening of the operating wavelengths used, even with wavelengths of 248 nm and, in particular, 193 nm technical difficulties arise in filtering out or separating the higher diffraction orders from those of the first diffraction orders using dichroic layers or a pinhole stop.

EP 0 243 520 B1 describes a method for aligning two objects in conjugate planes of an imaging system, the objects having first and second, respectively, optical crossed gratings as setting marks, and the first grating being illuminated by a light beam. In this case, the first crossed grating is a photolithographic mask, and the second grating is part of a wafer which is to be exposed photolithographically. In this case, the beams diffracted in the x- and y-directions by the crossed gratings are mutually separated by a $\lambda/2$ plate. The separation of the x- and y-directions can be performed in this case at any desired pass points of the beams. In this way, two useful signals are mutually separated and evaluated in photodetectors respectively assigned to them. There is nothing said in this printed publication concerning the treatment of beams of different diffraction orders, nor are the problems occurring in this case solved in this document.

It is the object of the present invention to create a method and a device for mutually aligning a mask pattern formed in a mask and a substrate on which the mask pattern is to be imaged, by using setting marks, the aim being to perform alignment with high accuracy and without excessively high absorption losses and scattering at the operating wavelength even in the case of projection systems with very short wavelengths.

According to the invention, this object is achieved by means of the method features named in the characterizing part of claim 1, and of the device features named in claim 4.

According to the invention, specific use is now made of a light beam with polarized light, a phase shift or a rotation of polarization for the first diffraction orders being undertaken in the beam path. A phase shift or rotation of polarization of 90°, which is achieved, for example, by a so-called $\lambda/2$ plate in the beam path, has proved to be the optimum phase shift in this case.

Once this phase shift has been undertaken according to the invention, higher diffraction orders and unwanted light are filtered out or separated in a next stage from the first diffraction orders, after which the light beams of first diffraction orders are subsequently detected, and the result is evaluated for alignment purposes.

It is possible, for example, to use an analyzer as separating device for separating the higher diffraction orders and unwanted light from the first diffraction orders.

If use is made for the illuminating device of the alignment system of a laser which generates polarized light, no further measures are required for the light beam. If no polarized light is to be generated by the exposing source, all that is required is to arrange a polarizer in the light beam upstream of the phase shift so that the separation according to the invention can be performed.

A substantially better signal-to-noise ratio than with the known dichroic layers is achieved using the method according to the invention and the device provided for the purpose.

It is advantageous that the device according to the invention can be used with a low outlay in existing systems. Moreover, the mode of procedure according to the invention and the device for the purpose are not limited to a specific type of lens but can, rather, be used for all types of lens which are used in a "through the lens alignment".

A further advantage according to the invention results in the fact that it is possible to achieve a higher total transmission of the lens. By comparison with the known solutions, lower production costs also result, in particular when there is no need to develop a new dichroic layer.

A very advantageous development of the invention consists in that the phase shift is undertaken in the pupil plane of an imaging system, for example a projection lens.

Specifically, in the pupil plane the individual diffraction orders are mutually separated in accordance with the Fourier transformation, the different angles of the diffraction orders being transformed at this point to different locations. This means that the individual diffraction orders are situated next to one another, as a result of which it is possible to act specifically on the first diffraction orders to produce their phase shift or rotation of polarization without influencing the other diffraction orders, doing so by specifically undertaking a phase shift with the aid of an appropriate phase-shifting device.

Figure 2:
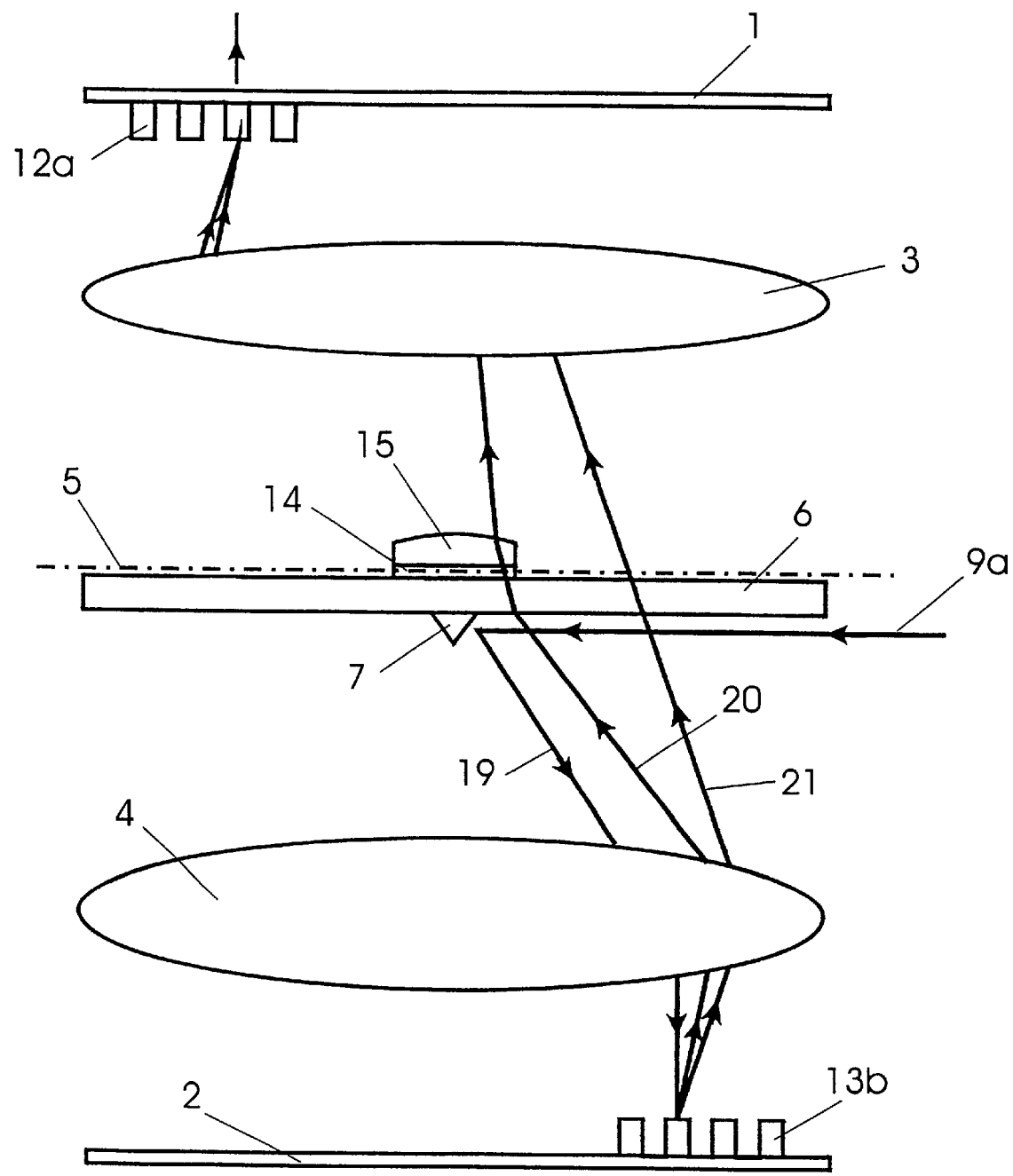

The invention is described by way of example below with the aid of the drawing, in which:

FIG. 1 shows a device according to the invention for mutually aligning a mask and a wafer in a photolithographic chip production method, in a basic representation; and FIG. 2 shows an enlarged representation of a section of FIG. 1, with the device for phase shifting according to the invention.

Photolithographic illuminating devices for producing chips and devices for aligning a mask pattern with a substrate are generally known, for which purpose reference is made, for example, to the publications imaged at the beginning, for which reason more detail is given below only on the parts essential to the invention.

Arranged between a mask 1, on which a mask pattern is imaged, and a substrate, for example a wafer 2, is a projection lens which is represented in a simplified way by lenses 3 and 4. An alignment plate 6 is arranged between the lenses 3 and 4, specifically in the pupil plane 5 of the projection lens. Located in the central region on the side of the alignment plate 6 facing the wafer 2 is a reflector prism 7 which deflects as alignment beam to the wafer 2 a polarized light beam 9 generated by a laser, for example an He-Ne illuminating laser 8. The polarized light beam 9 has previously been split up into a light beam 9a and a light beam 9b by a beam splitter 10. The light beam 9a strikes the reflector prism 7 directly, while the light beam 9b impinges on the other side of the reflector prism 7 by being deflected by a mirror 11. The division in two beams 9a and 9b is necessary because in each case two setting marks 12a and 12b are provided on the mask 1 and setting marks 13a and 13b on the wafer 2 with linear or parallel gratings. The linear gratings 12a and 12b of 13a and 13b, respectively, are provided in each case for the x- and y-directions for the purpose of precise alignment with reference to position and angle. Instead of a laser 8 with a beam splitter 10, it is, of course, also possible to use two lasers for separating generating the beams 9a and 9b.

A $\lambda/2$ plate 14 is arranged as phase-shifting device on the alignment plate 6 or in the pupil plane 5. Located downstream of the $\lambda/2$ plate in the beam direction is a correction lens 15. Located downstream of the mask 1 in the beam direction in each case is an analyzer or polarization filter 16 which is assigned to the setting mark 12a or 12b and downstream of which a detector 17, such as a four-quadrant diode (Quadcel) is arranged in each case. The values determined in the two detectors 17 are input into an evaluation device 18, which is indicated only by dashes in FIG. 1.

The device described above functions in the following way:

The alignment beam is deflected and projected through the lens 4 onto the setting marks 13a and 13b and reflected there. The beams of the zeroth diffraction order 19 are then retroflected through the reflector prism 7 in the direction of the beam 9. The remaining diffraction orders together with unwanted light are led through the alignment plate 6 and the lens 3 and subsequently strike the setting marks 12a and 12b, the beams reflected by the setting mark 13b striking the setting mark 12a, and, vice versa, the beams from the setting mark 13a striking the setting mark 12b.

The $\lambda/2$ plate 14 is located in the region in which the first diffraction orders 20 in the pupil plane 5 of the imaging system, specifically the projection lens with the lenses 3 and 4, pass through the alignment plate 6. This means that the $\lambda/2$ plate 14 rotates the beams of the first diffraction orders 20, which up until then were, for example, polarized parallel to the plane of incidence by a corresponding phase shift of 90°. Perpendicularly polarized light beams are therefore present downstream of the $\lambda/2$ plate 14 for the first diffraction orders 20.

As may be seen from the enlarged representation in FIG. 2, in which, for the purpose of simplification, one beam path is represented for the setting mark 12a to which the beams are projected from the setting mark 13b, the higher diffraction orders 21 and the unwanted light are led passed the $\lambda/2$ plate 14 and thereby continue to remain polarized in parallel. The perpendicularly polarized beams of the first diffraction orders 20 are more clearly imaged by the correction lens. Furthermore, said lens deflects the first diffraction orders 20 in such a way that the main beams meet again in the plane of the setting marks 12a and 12b together with the parallel-polarized beams of the higher diffraction orders 21 and with unwanted light.

By virtue of the fact that these beams are differently polarized, they can be separated from one another in a simple way in the downstream analyzers 16, since the analyzer thereby acts as a separating device 16 for separating the higher diffraction orders 21 and unwanted light from the first diffraction orders 20, with the result that only the first diffraction orders 20 are fed to the detector 17 arranged downstream thereof in the beam path.

What is claimed is:

1. A method for mutually aligning a mask pattern formed in a mask and a substrate, on which the mask pattern is to be imaged, by using setting marks in the mask and in the substrate, the alignment being performed with the aid of an imaging system and a light beam with polarized light, wherein
   a) a phase shift for the first diffraction orders (20) is undertaken in the beam path (9a, 9b),
   b) higher diffraction orders (21) and unwanted light are filtered out after the phase shift, and
   c) after the filtering out the light beams of first diffraction orders (20) are detected, and the result is evaluated for alignment purposes.

2. The method as claimed in claim 1, wherein the phase shift is performed in the pupil plane (5) of an imaging system (3, 4).

3. The method as claimed in claim 1, wherein a phase shift of $\lambda/2$ or odd multiples is undertaken.

4. A device for carrying out the method as claimed in claim 1, having an optical alignment system for aligning a mask (1) with setting marks (12a, 12b) with respect to the setting marks (13a, 13b) of a substrate (2), having an imaging system (3, 4), having an illuminating device (8) which generates a light beam from polarized light either directly or via a polarization filter, having a detector (17) and having an evaluating device (18), wherein
   a) a phase-shifting device (14) for the first diffraction orders (20) is arranged in the beam path (9a, 9b) of the light beam,
   b) downstream of the phase shift (14) in the beam direction, a separating device (16) is arranged for separating the higher diffraction orders (21) and unwanted light from the first diffraction orders (20), and c) downstream of the separating device (16) in the beam direction are arranged a detector (17) and an evaluating device (18) connected to the detector (17).

5. The device as claimed in claim 4, wherein the phase-shifting device (14) is located in the pupil plane (5) of an imaging system, in particular of a projection lens (3, 4).

6. The device as claimed in claim 4, wherein the phase-shifting device is a $\lambda/2$ plate (14).

7. The device as claimed in claim 4, wherein the separating device is an analyzer (16) for polarized light.

8. The device as claimed in claim 4, wherein the illuminating device has at least one laser (8) generating polarized light.

9. The device as claimed in claim 4, wherein the mask pattern is part of a photolithographic mask (1) and the substrate is part of a wafer (2).

* * * * *

UNITED STATES PATENT AND TRADEMARK OFFICE
CERTIFICATE OF CORRECTION

| | |
|---|---|
| PATENT NO. | : 6,294,296 B1 |
| DATED | : September 25, 2001 |
| INVENTOR(S) | : Bernhard Weigl |

It is certified that error appears in the above-identified patent and that said Letters Patent is hereby corrected as shown below:

<u>Column 1,</u>
Line 13, reads "surf ace" should read -- surface --

Signed and Sealed this

Thirtieth Day of April, 2002

Attest:

JAMES E. ROGAN
*Director of the United States Patent and Trademark Office*

*Attesting Officer*